(12) United States Patent
Dentinger et al.

(10) Patent No.: US 6,582,890 B2
(45) Date of Patent: Jun. 24, 2003

(54) MULTIPLE WAVELENGTH PHOTOLITHOGRAPHY FOR PREPARING MULTILAYER MICROSTRUCTURES

(75) Inventors: Paul Michael Dentinger, Livermore, CA (US); Karen Lee Krafcik, Livermore, CA (US)

(73) Assignee: Sandia Corporation, Livermore, CA (US)

(*) Notice: Subject to any disclaimer, the term of this patent is extended or adjusted under 35 U.S.C. 154(b) by 11 days.

(21) Appl. No.: 09/799,744

(22) Filed: Mar. 5, 2001

(65) Prior Publication Data
US 2002/0122918 A1 Sep. 5, 2002

(51) Int. Cl.$^7$ .............................. G03C 5/58; G03F 7/00; C25D 1/10
(52) U.S. Cl. ...................... 430/322; 430/312; 430/313; 430/394
(58) Field of Search ................................ 430/312, 313, 430/315, 322, 394

(56) References Cited

U.S. PATENT DOCUMENTS

| | | | | |
|---|---|---|---|---|
| 4,882,245 A | | 11/1989 | Gelorme et al. ............... 430/14 |
| 5,059,512 A | | 10/1991 | Babich et al. ............... 430/280 |
| 5,407,787 A | * | 4/1995 | McElhanon et al. ........ 430/315 |
| 5,580,511 A | * | 12/1996 | Sakai et al. ................... 264/317 |
| 5,622,611 A | * | 4/1997 | Marks et al. ................... 205/50 |
| 5,830,624 A | * | 11/1998 | Bae et al. ..................... 430/314 |
| 6,150,256 A | * | 11/2000 | Furukawa et al. ........... 430/312 |
| 6,333,555 B1 | * | 12/2001 | Farnworth et al. ........... 257/692 |

OTHER PUBLICATIONS

Wenmin Qu et al.; "UV–LIGA: A Promising and Low–Cost Variant for MIcrosystem Technology". Proc IEEE, optoelectronic and microelectronic materials and devices; Dec., 1998, p. 380–383.*

Flack et al. (1998), "Characterization of Ultra–thick Photoresists for MEMS Applications Using a 1X Stepper," *SPIE Conference on Materials and Device Characterization in Micromachining* 3512:296–315.

Ghandhi (1994), *VLSI Fabrication Principles—Silicon and Gallium Arsenide*, pp. 687–690.

Löchel et al. (1994), "Galvanoplated 3D Structures for Micro Systems," *Microelectronic Engineering* 23(1–4):455–459.

E. Cullmann et al. "Advanced Resist Processing for Thick Photoresist Applications"; Microelectronic Engg. v30 (1996) pp. 551–554.*

* cited by examiner

*Primary Examiner*—Mark F. Huff
*Assistant Examiner*—Kripa Sagar
(74) *Attorney, Agent, or Firm*—Reed & Eberle LLP; Louis L. Wu

(57) ABSTRACT

The invention relates to a multilayer microstructure and a method for preparing thereof. The method involves first applying a first photodefinable composition having a first exposure wavelength on a substrate to form a first polymeric layer. A portion of the first photodefinable composition is then exposed to electromagnetic radiation of the first exposure wavelength to form a first pattern in the first polymeric layer. After exposing the first polymeric layer, a second photodefinable composition having a second exposure wavelength is applied on the first polymeric layer to form a second polymeric layer. A portion of the second photodefinable composition is then exposed to electromagnetic radiation of the second exposure wavelength to form a second pattern in the second polymeric layer. In addition, a portion of each layer is removed according to the patterns to form a multilayer microstructure having a cavity having a shape that corresponds to the portions removed.

29 Claims, 6 Drawing Sheets

MULTIPLE WAVELENGTH PHOTOLITHOGRAPHY FOR PREPARING MULTILAYER MICROSTRUCTURES

ACKNOWLEDGEMENT OF GOVERNMENT SUPPORT

The United States Government has rights in this invention pursuant to Contract No. DE-AC04-94AL85000 between the United States Department of Energy and Sandia Corporation for the operation of Sandia National Laboratories.

TECHNICAL FIELD

This invention relates generally to photolithographic preparation of multilayer and/or high aspect ratio microstructures. More specifically, the invention relates to the preparation of such microstructures using electromagnetic radiation of multiple wavelengths.

BACKGROUND

"Nanotechnology" refers to nanometer-scale manufacturing processes, materials and devices, as associated with, for example, nanometer-scale lithography and nanometer-scale information storage. See, for example, *Nanotechnology*, ed. G. Timp (New York: Springer-Verlag, 1999), and *Nanoparticles and Nanostructured Films*, ed. J. H. Fendler (Weinheim, Germany: Wiley-VCH, 1998). Nanometer-scale components find utility in a wide variety of fields, particularly in the fabrication of microelectromechanical systems (commonly referred to as "MEMS"). Such systems include, for example, micro-sensors, micro-actuators, micro-instruments, micro-optics, and the like. Many MEMS fabrication processes exist, and tend to fall into the two categories of surface micro-machining and bulk-micromachining. The latter technique involves formation of microstructures by etching directly into a bulk material, typically using wet chemical etching or reactive ion etching ("RIE"). Surface micro-machining involves fabrication of microelectromechanical systems from films deposited on the surface of a substrate, e.g., from thin layers of polysilicon deposited on a sacrificial layer of silicon dioxide present on a single crystal silicon substrate (this technique is commonly referred to as the "thin film polysilicon process").

An exemplary surface micro-machining process is known as "LIGA." See, for example, Becker et al. (1986), "Fabrication of Microstructures with High Aspect Ratios and Great Structural Heights by Synchrotron Radiation Lithography Galvanoforming, and Plastic Moulding (LIGA Process)," *Microelectronic Engineering* 4(1):35–36; Ehrfeld et al. (1988), "1988 LIGA Process: Sensor Construction Techniques via x-Ray Lithography," *Tech. Digest from IEEE Solid-State Sensor and Actuator Workshop*, Hilton Head, S.C.; Guckel et al. (1991) *J. Micromech. Microeng.* 1: 135–138. A related process is termed "SLIGA," and refers to a LIGA process involving sacrificial layers. LIGA is the German acronym for X-ray lithography ("lithographic"), electrodeposition ("galvanoformung") and molding ("abformtechnik"), and was developed in the mid-1970's. LIGA involves deposition of a relatively thick layer of an X-ray resist on a substrate, e.g., metallized silicon, followed by exposure to high-energy X-ray radiation through an X-ray mask, and removal of the irradiated resist portions using a chemical developer. The mold so provided can be used to prepare structures having horizontal dimensions—i.e., diameters—on the order of microns. The technique is now used to prepare metallic microcomponents by electroplating in the recesses (i.e., the developed regions) of the LIGA mold. See, e.g., U.S. Pat. No. 5,190,637 to Guckel et al. and U.S. Pat. No. 5,576,147 to Guckel et al.

Typically, complex three-dimensional microcomponents may be formed in part by successive application of LIGA or other lithographic techniques. First, a mold is prepared by depositing a layer of resist on a substrate, exposing the layer of resist to radiation through a patterned mask, and removing the resist layer according to the pattern. The mold is filled with a filler material, e.g., a metal, that will eventually become the three-dimensional component or a portion thereof. To ensure that no voids are included in the final microcomponent, the mold may be "overfilled," i.e., excess filler material is used in filling the mold. Polishing is then carried out to expose a surface on which another mold may be formed by using the above-described process. By controlling the thickness of each resist layer and using an appropriate sequence of masks, a desired complex shape may be formed. However, this technique is not easily adaptable for large scale production because of the difficulty in carrying out the series of lithographic, filling and polishing steps, particularly in view of the size of such microcomponents.

There are a number of advantages associated with the use of deep X-ray lithography techniques such as LIGA in the preparation complex three-dimensional microcomponents. In addition, since X-ray photons are short wavelength particles, diffraction effects are absent for mask dimensions above 0.1 micrometer. Moreover, because X-ray photons are absorbed by atomic processes, standing wave problems, which can limit exposures of thick photoresist by electromagnetic radiation having long wavelengths are not problematic for X-ray exposures.

Ordinarily, LIGA requires a synchrotron that yields high flux densities, several watts per square centimeter, as the source of X-ray photons. Such sources generate X-rays with excellent collimation to produce thick photoresist exposures without any horizontal "run-out" as is described below. Locally exposed patterns therefore result in vertical photoresist walls if a developing system with very high selectivity between exposed and unexposed photoresist is available. However, the use of X-ray technology is also an inherent drawback in ordinary LIGA processes. For example, the dangers of X-ray exposure to living tissue are well known. In addition, X-ray technology and associated specialized equipment, X-ray masks and synchrotrons in particular, involve great cost due to the high-degree of expertise required to design, manufacture, operate and to maintain such equipment. For example, X-ray masks typically require hours to make while production of ordinary UV lithography masks require only a few minutes. Thus, there are strong economic incentives to find an alternative source or wavelength of electromagnetic radiation in order to carry out LIGA or other photolithographic processes for thick film applications.

One possible alternative to using X-ray technology is to employ ultraviolet-wavelength-based photolithography. Such photolithography is commonly practiced in semiconductor manufacturing processes and has been characterized. See, e.g., Flack et al. (1998), "Characterization of Ultra-thick Photoresists for MEMS Application s Using a 1× Stepper," *SPIE conference on Materials and Device Characterization in Micromachining*, 3512:296–315, and Löchel et al. (1994), "Galvanoplated 3D Structures for Micro Systems," *Microelectronic Engineering* 23:455–459. Consequently, equipment associated with ultraviolet photolithography is much less expensive and much more commercially available than synchrotrons and other X-ray equipment as a whole. However, as a general rule, ordinary photolithographic techniques using ultraviolet radiation cannot achieve the resolution and the aspect ratios associated with ordinary LIGA process using X-ray technology.

Advanced photolithographic techniques have been proposed in semiconductor processing in order to achieve definition of fine lines with high aspect ratios. Such techniques may involve the use of multilayer resists as described in Ghandi, *VLSI Fabrication Principles, Silicon and Gallium Arsenide* 687–690 (2$^{nd}$ ed., John Wiley & Sons, 1994). This section of the textbook describes that there are two situations in which two layers of photoresist may be used. The first situation involves providing a first resist layer with high radiation sensitivity on a second resist layer having a low radiation sensitivity, exposing both resist layers to optical radiation and developing the layers. As described, this situation tends to result in significant undercutting to the thicker resist layer and is therefore unsuitable for most LIGA or other applications for producing microcomponents having high aspect ratios. The second situation also require two resist layers, a first resist layer sensitive to electromagnetic radiation of a first wavelength but opaque to a second wavelength and a second resist layer sensitive to electromagnetic radiation of the second wavelength. The first resist layer is applied on the second polymeric layer, and the first resist layer is exposed to radiation of the first wavelength and developed to define a pattern therein. The pattern is then used as a mask to expose the second resist layer to radiation of the second wavelength. The drawback of the second situation is that the first polymeric layer must be sufficiently thin to avoid standing wave, diffraction and other like problems. It is evident, then, that neither situation results in features having aspect ratios comparable to those using X-ray technology.

Thus, there is a need in the art for alternative methods that provide for microcomponents having high-aspect ratio features similar to those made by LIGA or other X-ray lithographic processes without use of X-ray. In addition, it is further evident that opportunities exist in the art for using multilayer and/or multiple wavelength lithography to enhance versatility of lithographic fabrication of complex three-dimensional microcomponents.

SUMMARY OF THE INVENTION

Accordingly, the invention is directed to the aforementioned need in the art and provides a method for preparing a multilayer microstructure using photodefinable compositions having different exposure wavelengths.

It is another object of the invention to provide such a method that allows greater flexibility in forming three-dimensional microstructures and microcomponents than ordinary LIGA or other X-rays technologies It is a further object of the invention to provide such a method in order to form multilayer microstructures having a feature exhibiting an aspect ratio that exceeds the capacities predicted by aerial image calculations.

Additional objects, advantages and novel features of the invention will be set forth in part in the description which follows, and in part will become apparent to those skilled in the art upon examination of the following, or may be learned by practice of the invention.

In a general aspect, the invention relates to a method for preparing a multilayer microstructure. The method involves applying a first photodefinable composition having a first exposure wavelength on a substrate to form a first polymeric layer and exposing a portion of the first photodefinable composition to electromagnetic radiation of the first exposure wavelength to form a first pattern in the first polymeric layer. Then, a second photodefinable composition having a second exposure wavelength is applied on the first polymeric layer to form a second polymeric layer. After a portion of the second photodefinable composition is exposed to electromagnetic radiation of the second exposure wavelength to form a second pattern in the second polymeric layer, a portion of each layer is removed according to the patterns to form a multilayer microstructure having a cavity having a shape that corresponds to the portion removed from the layers. Preferably, one of the first or second exposure wavelengths is an ultraviolet or visible wavelength. Optimally, both the first and the second exposure wavelengths are ultraviolet or visible wavelengths. Optionally, the multilayer microstructure is used as a mold in which the cavity is filled with a material that conforms to the shape of the cavity. By separating the material from the multilayer structure without substantially disturbing the material, the method may be adapted to form microcomponents or features of microcomponents having high aspect ratios as well as three-dimensional shapes.

In another aspect, the invention relates to a multilayer microstructure that comprises a substrate, a first polymeric layer on the substrate, a second polymeric layer on the first polymeric layer and a cavity extending through each polymeric layer and terminating at the substrate. The cavity has a substantially identical cavity cross-sectional area along the height of the cavity and an aspect ratio of at least approximately 30:1. The multilayer structure allows microcomponents or features thereof to be formed having a high aspect ratio without using X-ray lithography.

BRIEF DESCRIPTION OF THE DRAWINGS

FIG. 1 illustrates a method in which ultraviolet radiation is used to lithographically form a two-layer microstructure. FIG. 1A illustrates the first step of the prior art method in which two successive layers of photoresist is applied on a substrate surface. FIG. 1B illustrates the simultaneous exposure of the two layers to a pattern in a mask using imperfectly collimated radiation or radiation which is subject to some other aerial degradation such as diffraction. FIG. 1C illustrates the profile of the layers after exposure to radiation and development.

FIG. 2A illustrates a first patterning step wherein a mask is used to impart a pattern on first photodefinable composition layer on a substrate through exposure to electromagnetic radiation having a first wavelength. FIG. 2B illustrates a second patterning step wherein the mask is used again to impart the same pattern on a second photodefinable composition layer on the first polymeric layer through exposure to electromagnetic radiation having a second wavelength. FIG. 2C illustrates the removal of a portion of each layer to form a multilayer microstructure having a cavity having an aspect ratio of at least 30:1.

FIG. 3A illustrates in cross sectional view a first patterning step wherein a first mask is used to impart a first pattern on a first polymeric layer on a substrate through exposure to electromagnetic radiation having a first wavelength. FIG. 3B illustrates a top view of the first mask. FIG. 3C illustrates in cross-sectional view a second patterning step wherein a second mask is used to impart a second pattern, different from the first pattern, on a second photodefinable composition layer on the first polymeric layer through exposure to electromagnetic radiation having a second wavelength. FIG. 3D illustrates in top view the second mask. Each of FIGS. 3E and 3F illustrates the removal of a portion of each layer according to the patterns to form a multilayer microstructure having a cavity having a shape that corresponds to the portion removed from the layers. FIG. 3E illustrates a version wherein the second polymeric layer is substantially opaque to electromagnetic radiation of the first wavelength; FIG. 3F illustrates a version wherein the second polymeric layer is substantially transparent to electromagnetic radiation of the first wavelength. Each of FIGS. 3G and 3H illustrates a microcomponent having a shape that corresponds to the mold formed in FIGS. 3E and 3F, respectively.

DETAILED DESCRIPTION OF THE INVENTION

Definitions and Overview

Figure 1A:
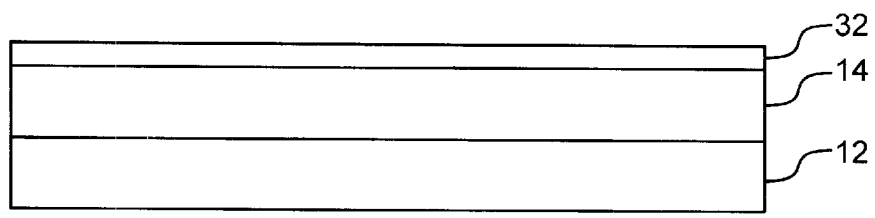
FIGS. 1A, 1B, and 1C, collectively referred to as FIG. 1, schematically illustrate in cross-sectional view a prior art method that employs multilayer photoresist technology and shows the problems associated therewith in forming features having high aspect ratios.

Before describing the present invention in detail, it is to be understood that this invention is not limited to materials (e.g., specific polymers or materials), processing conditions, manufacturing equipment, or the like, as such may vary. It is also to be understood that the terminology used herein is for the purpose of describing particular embodiments only and is not intended to be limiting.

It must be noted that, as used in the specification and the appended claims, the singular forms "a," "an" and "the" include plural referents unless the context clearly dictates otherwise. Thus, for example, reference to "a curable composition" includes mixtures of curable composition, reference to "an exposure wavelength" includes range of exposure wavelengths, the like.

In describing and claiming the present invention, the following terminology will be used in accordance with the definitions set out below.

The term "aspect ratio" is used herein in its conventional sense to refer to the ratio of an object's height to its width (or diameter). High aspect ratio structures are thus prepared using molds (such as LIGA molds) having cavities, voids, or recesses, that are extremely narrow relative to their height.

The terms "microstructure" and "microcomponent" are used herein to refer to either a three-dimensional solid structure whose height, width (or diameter) or length is less than approximately 100 microns, i.e., at least one dimension of the three-dimensional structure is less than approximately 100 microns. While used interchangeably in some instances, the term microstructure as used herein usually describes a three-dimensional form having a layered structure and the term "microcomponent" does not necessarily refer to a layered structure.

"Optional" or "optionally" means that the subsequently described circumstance may or may not occur, so that the description includes instances where the circumstance occurs and instances where it does not.

The term "polymer" is used herein in its conventional sense to refer to a compound having two or more monomer units, and is intended to encompass homopolymers as well as copolymers, including, for example, graft copolymers. Those compositions herein that are referred to as "photodefinable" are polymeric and capable of increasing or decreasing in a physical characteristic, e.g., mechanical integrity or solubility to a developer, upon exposure to electromagnetic radiation, wherein, e.g., increased mechanical integrity from crosslinking and decreased mechanical integrity may result from photolytic breakdown. Examples of photodefinable compositions include, but are not limited to, positive and negative photoresists.

The term "substantially identical" as used herein generally but not necessarily refers to a plurality of two-dimensional shapes having the same or nearly the same dimensions such that corresponding dimensions of the shapes do not differ by more than approximately 15%. Preferably, the corresponding dimensions do not differ by more than 5% and optimally by more than approximately 1%. For example, two circles have substantially identical areas when the areas are within approximately 10% of each other.

The Inventive Methods and Multilayered Microstructures

The invention thus relates to a multilayer microstructure and a method for preparing the microstructure. The method involves first applying a first photodefinable composition having a first exposure wavelength on a substrate to form a first polymeric layer. A portion of the first photodefinable composition is then exposed to electromagnetic radiation of the first exposure wavelength to form a first pattern in the first polymeric layer. After exposing the first polymeric layer, a second photodefinable composition having a second exposure wavelength is applied on the first polymeric layer to form a second polymeric layer. A portion of the second photodefinable composition is then exposed to electromagnetic radiation of the second exposure wavelength to form a second pattern in the second polymeric layer. In addition, a portion of each layer is removed according to the patterns to form a multilayer microstructure having a cavity having a shape that corresponds to the portion removed from the layers. Optionally, the cavity is filled with a material that conforms to the shape of the cavity and the material is separated from the multilayer structure without substantially disturbing the material. The method may be adapted to form microcomponents having high aspect ratios or features of microcomponents having high aspect ratios for both positive and negative resists. One of ordinary skill in the art will recognize that the examples provided herein relate to positive resists but will be able to apply the teaching of the examples to negative resists as well.

Figure 1B:
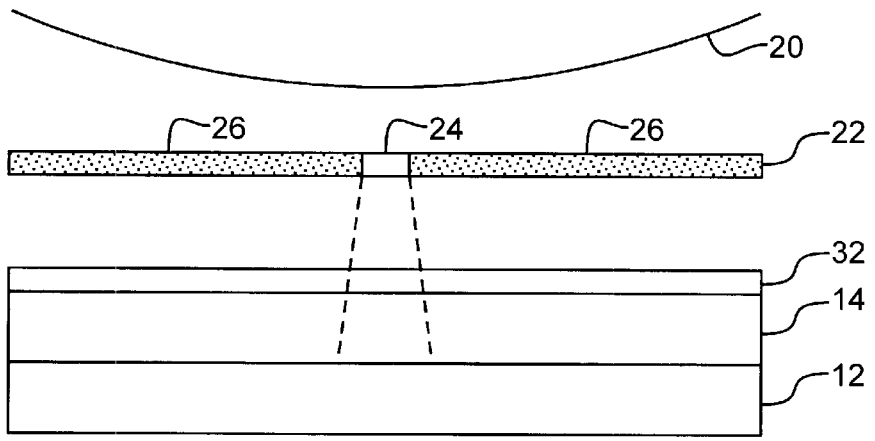
Figure 1C:
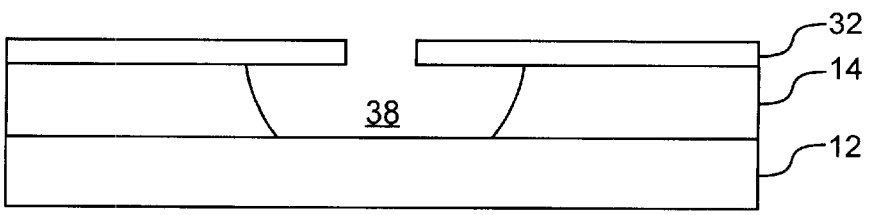

In order to illustrate the advantages of the present invention, a prior art method and disadvantages associated therewith is shown FIG. 1. As with all figures herein, FIG. 1 is not to scale, and certain dimensions may be exaggerated for clarity of presentation. FIG. 1, schematically illustrate in cross-sectional view a prior art method that employs multilayer photoresist technology. FIG. 1A illustrates the first step of the prior art method in which two successive layers of photoresist is applied on a surface of substrate 12. A first photodefinable composition is applied as a first polymeric layer 14 on a substrate, and a second photodefinable composition is applied as a second polymeric layer 32 on the first polymeric layer 14. Typically the second polymeric layer 32 is thinner and has a lower radiation sensitivity than the first polymeric layer 14. In FIG. 1B, a source of radiation 20 is provided that produces imperfectly collimated radiation, i.e., "run out," or other such aerial image degradation such as diffraction. Also provided is a mask 22 that has a pattern formed thereon from a substantially transparent portion 24 and a substantially opaque portion 26. The imperfectly collimated radiation is transmitted through the transparent portion 24 of the mask 22 which simultaneously exposes the two layers to the pattern. FIG. 1B shows an idealized situation wherein, the radiation is not scattered, yet due to the imperfection in collimation, the cross-sectional area of the imperfectly collimated radiation increases with distance to the radiation source, as indicated by the dotted lines. As a result, even assuming no scattering, features having high aspect ratios are not possible with imperfectly collimated radiation. FIG. 1C illustrates the typical profile of the layers of resist after exposure to radiation and development. Upon exposure and development, the second polymeric layer 32 will etch slowly. The first polymeric layer 14, on the other hand, will etch rapidly thus undercutting the second polymeric layer 32. In addition, one of ordinary skill in the art will recognize that other undesirable material removal profiles may result as well. Thus, it is evident that the cavity 38 formed through development removal of the exposed portion does not exhibit a high aspect ratio and that, as a general rule, conventional multilayer photoresist techniques are not suitable for forming microstructures or microcomponents with high aspect ratios, particularly those that exceed about 15:1.

Figure 2A:
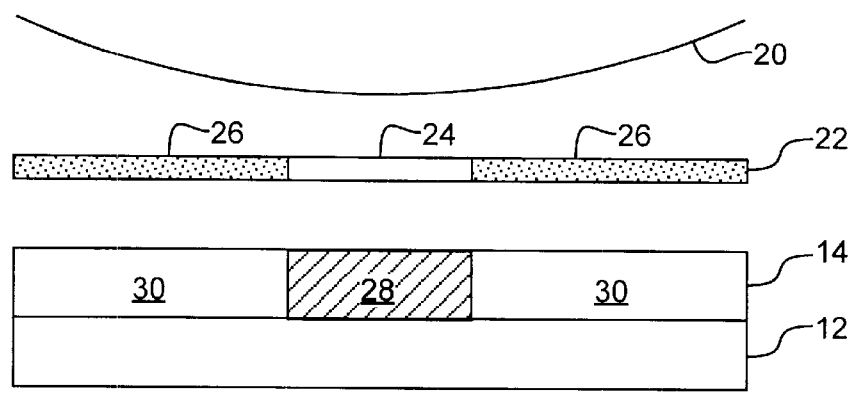
FIGS. 2A, 2B and 2C, collectively referred to as FIG. 2, schematically illustrate in cross-sectional view an embodiment of the present invention wherein a multilayer microstructure is formed comprising a substrate, a first polymeric layer on the substrate, a second polymeric layer on the first polymeric layer and a cavity extending through each polymeric layer and terminating at the substrate, wherein the cavity has a substantially identical cavity cross-sectional area along the height of the cavity and an aspect ratio of at least 30:1.

FIG. 2, schematically illustrates in cross-sectional view an embodiment of the present invention wherein prior art limitations relating to the formation of features with high aspect ratios are overcome. This embodiment provides a multilayer microstructure 10 comprising a first polymeric layer 14 on a substrate 12, a second polymeric layer 32 on the first polymeric layer and a cavity 38 extending through each polymeric layer and terminating at the substrate, wherein the cavity has a substantially identical cavity cross-sectional area along the height of the cavity and an aspect ratio of at least 30:1. As illustrated in FIG. 2A, a first photodefinable composition having a first exposure wavelength is applied on a substrate to form a first polymeric layer 14. A source 20 of electromagnetic radiation is provided in order to generate substantially collimated radiation. A patterned mask 22 having a pattern formed from transparent portion 24 and an opaque portion 26 is placed between the radiation source 20 and the first polymeric layer 14 in order to expose the first photodefinable composition to electromagnetic radiation of the first exposure wavelength according to the pattern. As a result, radiation is transmitted through the transparent portion 24 resulting in the formation in the first polymeric layer of an exposed portion 28 and an unexposed portion 30. The shape of exposed portion 28 of the first polymeric layer corresponds to the shape of the transparent portion 24 of the mask and the shape of the unexposed portion 30 of the first polymeric layer corresponds to the shape of the opaque portion 26 of the mask. As shown, the ratio width of the exposed portion to the thickness of the layer is about 1:15. Preferably, the width-to-thickness ratio may be no more than about 1:20. It should be evident that the width to thickness ratio is limited by the specific photodefinable material and the radiation wavelength used. It is believed that a ratio of approximately 1:15 to approximately 1:20 is achievable using certain photodefinable materials adapted for curing with ultraviolet radiation.

Figure 2B:
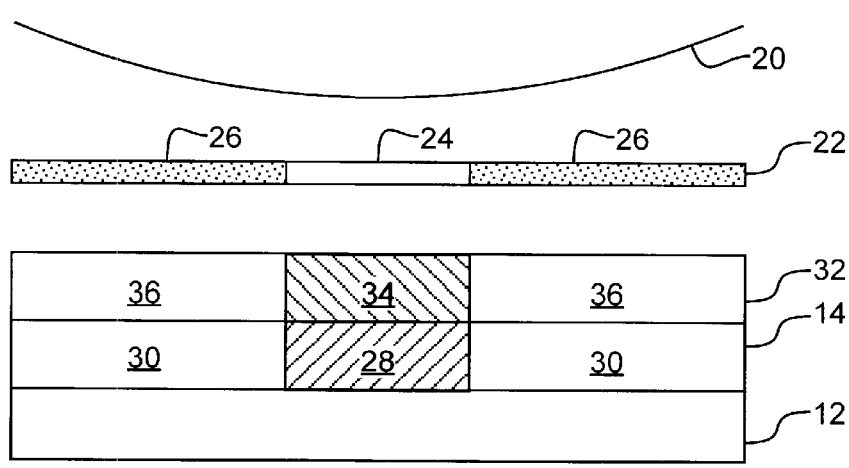

Then, as illustrated in FIG. 2B, a second photodefinable composition having a second exposure wavelength is applied on the first polymeric layer to form a second polymeric layer 32. The thickness of the second polymeric layer 32 is typically about the same as that of the first polymeric layer 14. Optionally, the thickness can be substantially greater or less than the thickness of the first layer. Again, the source 20 of electromagnetic radiation is provided in order to generate substantially collimated radiation. In addition, the same patterned mask 22 is positioned between the radiation source 20 and the second polymeric layer 32 in order to expose the second photodefinable composition to electromagnetic radiation of the second exposure wavelength according to the pattern. Thus, it is evident that the radiation source 20 is adapted to generate electromagnetic radiation of both exposure wavelengths. As a result, radiation is transmitted through the transparent portion 24 of the mask 22 resulting in the formation in the second polymeric layer 32 an exposed portion 34 and an unexposed portion 36. Similar to the pattern formed in the first polymeric layer, the shape of exposed portion 34 of the second polymeric layer corresponds to the shape of the transparent portion 24 of the mask and the shape of the unexposed portion 36 of the second polymeric layer corresponds to the shape of the opaque portion 26 of the mask. By proper alignment of the mask, the exposed portion 34 of the second polymeric layer is aligned with the exposed portion 28 of the first polymeric layer. Moreover, it is preferred in this instance that the second polymeric layer is substantially opaque to electromagnetic radiation of the first wavelength.

Figure 2C:
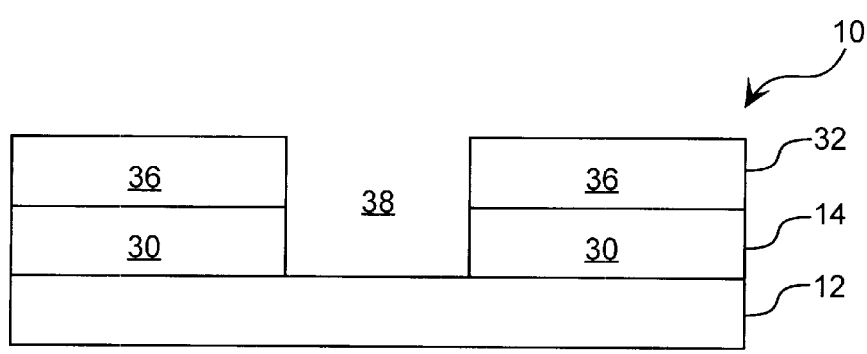

As shown in FIG. 2C, once both layers have been exposed to the same pattern, portions of each layer are removed according to the pattern to form a multilayer microstructure having a cavity having a shape that corresponds to the portion removed from the layers. In this case, the portions removed are the exposed portions indicated at 28 and 34, respectively. However, in other cases, the unexposed portions may be removed instead. As a result, a cavity 38 is formed extending through each layer and terminating at the substrate 12, wherein the cavity has a substantially identical cavity cross-sectional area along the height of the cavity and an aspect ratio of at least approximately 30:1. As shown, the cavity is composed of two portions, a first polymeric layer portion and a second polymeric layer portion. Each portion of the cavity has an aspect ratio of at least approximately 15:1. It should be evident if the ratio of the width of the cavity to the thickness of each layer is about 1:20, the aspect ratio of the cavity would be approximately 40:1

Figure 3A:
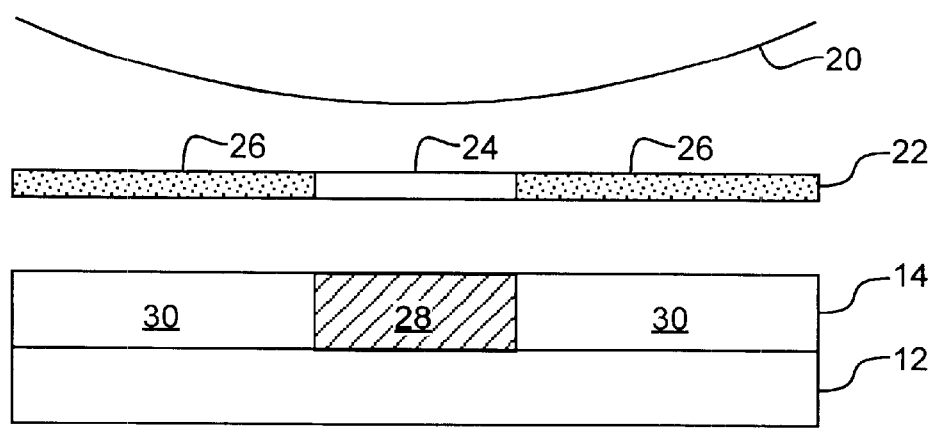
FIGS. 3A, 3B, 3C, 3D, 3E, 3F, 3G and 3H, collectively referred to as FIG. 3, schematically illustrate two versions of the inventive method wherein three-dimensional microstructures are formed that may serve as molds for microcomponents.
Figure 3B:
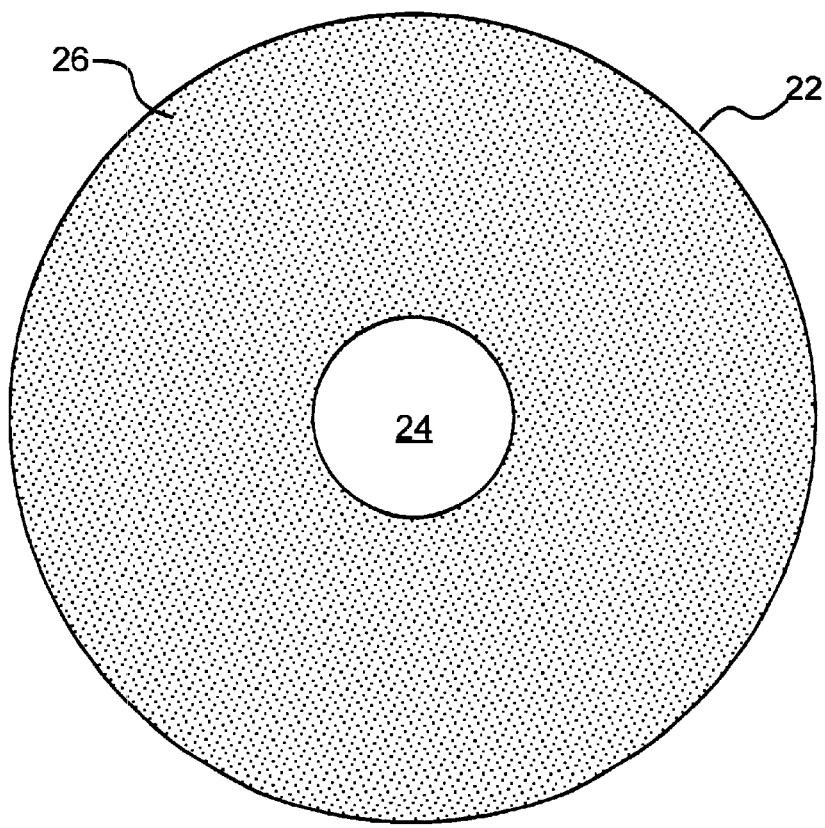

In addition to providing a way to microstructures with high aspect ratios without relying on use of X-ray equipment, the invention also provides greater flexibility in forming three-dimensional microstructures and microcomponents. FIG. 3, schematically illustrate how the inventive method provides greater flexibility in forming a three-dimensional microstructures may serve as a mold for a microcomponent. FIG. 3A illustrates in cross-sectional view a first patterning step wherein a first mask 22 is used to impart a first pattern on a first polymeric layer 14 on a substrate through exposure to electromagnetic radiation having a first wavelength. This patterning step is similar to that illustrated in FIG. 2A in that a first photodefinable composition having a first exposure wavelength on a substrate to form a first polymeric layer 14. A source 20 of electromagnetic radiation is provided in order to generate substantially collimated radiation. A first mask 22 having a pattern formed from transparent portion 24 and an opaque portion 26 is placed between the radiation source 20 and the first polymeric layer 14 in order to expose the first photodefinable composition to electromagnetic radiation of the first exposure wavelength according to the pattern. FIG. 3B illustrates a top view of the first mask, wherein the transparent portion 24 is in the shape of a circle. As a result, radiation is transmitted through the transparent portion 24 resulting in the formation in the first polymeric layer of an exposed portion 28 and an unexposed portion 30. The shape of exposed portion 28 of the first polymeric layer corresponds to the shape of the transparent portion 24 of the mask and the shape of the unexposed portion 30 of the first polymeric layer corresponds to the shape of the opaque portion 26 of the mask.

Figure 3C:
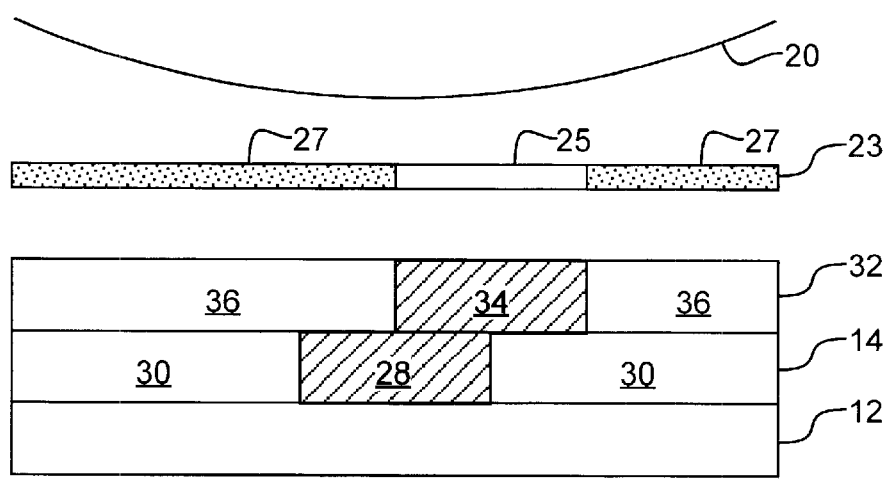
Figure 3D:
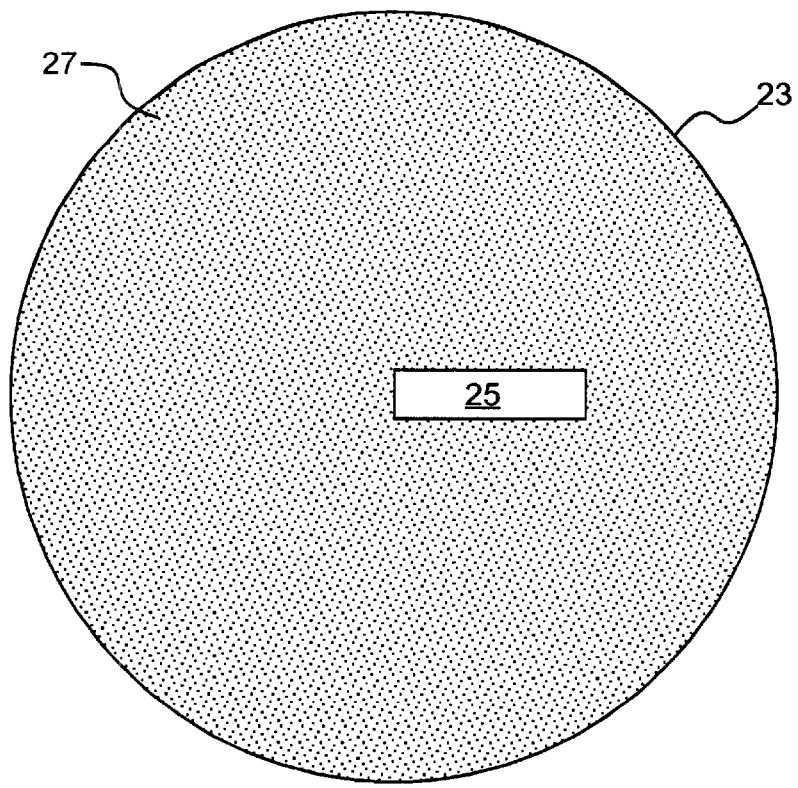

Then, as illustrated in FIG. 3C, a second photodefinable composition having a second exposure wavelength is applied on the first polymeric layer to form a second polymeric layer 32. Again, the source 20 of electromagnetic radiation is provided in order to generate substantially collimated radiation. In addition, a second mask 23 having a pattern formed from transparent portion 25 and an opaque portion 27 is placed between the radiation source 20 and the second polymeric layer 32 in order to expose the second photodefinable composition to electromagnetic radiation of the second exposure wavelength according to the pattern. FIG. 3D illustrates a top view of the second mask, wherein the transparent portion 25 is in the shape of a rectangle. Accordingly, it is evident that the pattern of the second mask 23 is different from the first pattern. Again, the radiation source 20 is adapted to generate electromagnetic radiation of both exposure wavelengths. As a result, radiation of both the first and second exposure wavelengths are transmitted through the transparent portion 25 of the second mask 23 resulting in the formation in the second polymeric layer 32 an exposed portion 34 and an unexposed portion 36. While the same radiation source is used for exposing both layers to radiation of appropriate wavelengths, one of ordinary skill in the art will recognize that two different sources of radiation may be used, each source adapted to generate radiation having a wavelength appropriate to cure only one of the photodefinable compositions.

Figure 3E:
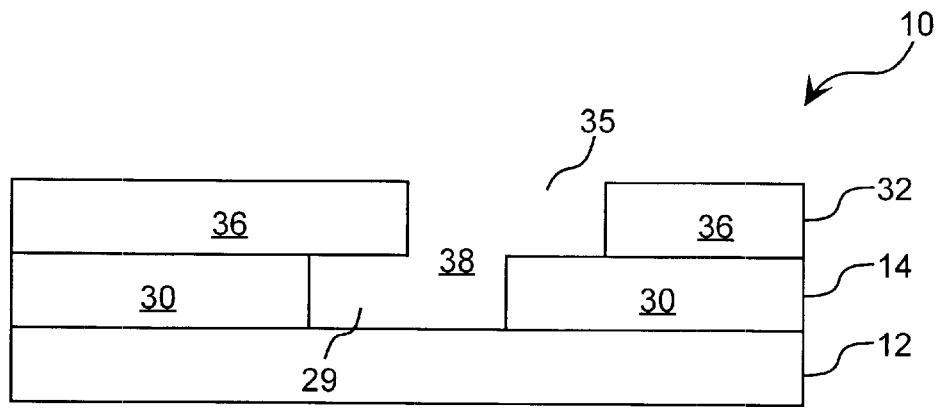
Figure 3F:
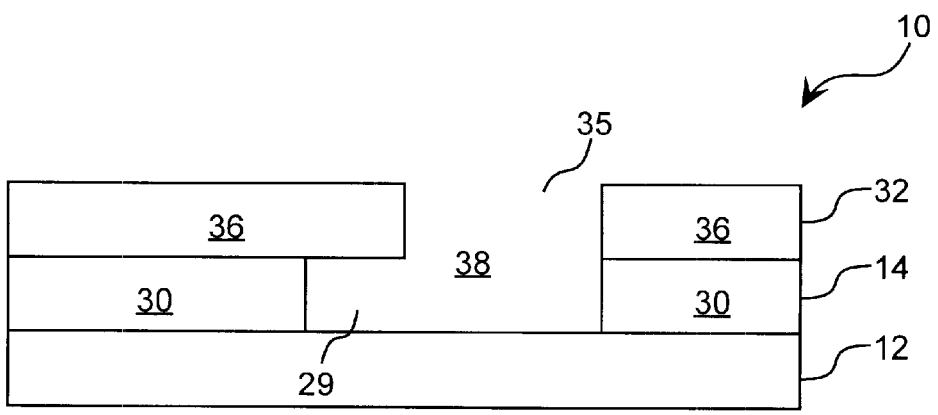

By removing the exposed portion of the layers as shown in FIGS. 3E and 3F, a multilayer microstructure 10 having a cavity having a shape that corresponds to the portion removed from the layers is formed. The multilayer microstructure 10 may be used as a mold. In addition, depending on the transmission properties of the second mask and the second polymeric layer with respect to electromagnetic radiation of the first exposure wavelength, the second exposure of electromagnetic radiation may produce a different result. For example, when the second polymeric layer 32 is substantially opaque to electromagnetic radiation of the first wavelength, as illustrated in FIG. 3E, no portion of the first polymeric layer 14 is exposed to electromagnetic radiation of the first wavelength after patterning with the first mask 22. Thus, when the second polymeric layer is substantially opaque to radiation of the first exposure wavelength, the shape of the first polymeric layer portion 29 of the cavity 38 corresponds to the shape of the transparent portion 24 of the first mask 22. However, when the second polymeric layer 32 is substantially transparent to electromagnetic radiation of the first wavelength, as illustrated in FIG. 3F, a portion of the first polymeric layer 14 is exposed to electromagnetic radiation of the first wavelength in a pattern that corresponds to the pattern of the second mask 23. Thus, when the second polymeric layer 32 is substantially transparent to electromagnetic radiation of the first wavelength, the shape of the first polymeric layer portion 29 of the cavity 38 corresponds to the superimposed shape of patterns of both masks.

Figure 3G:
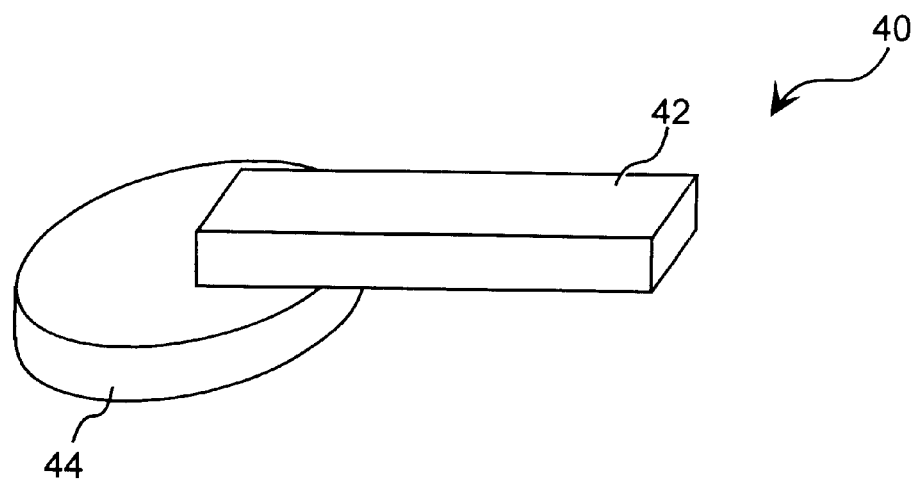
Figure 3H:
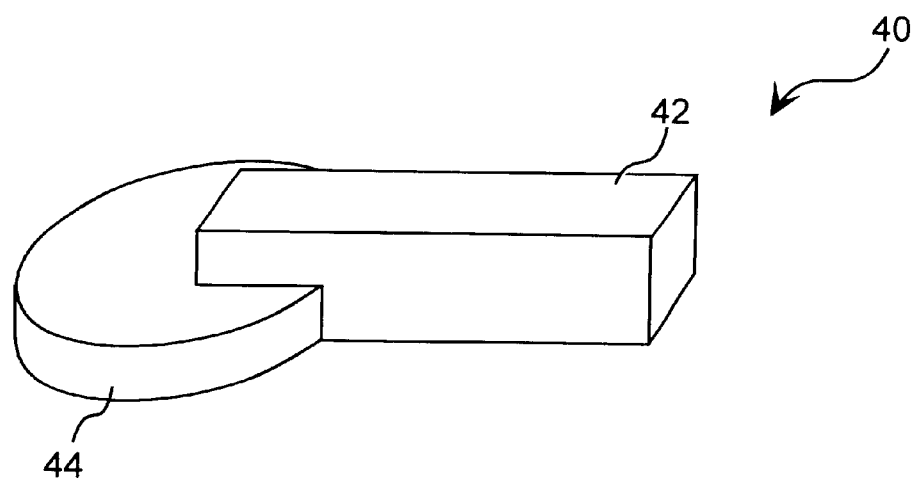

The microstructures described above may be used for a variety of purposes including, but not limited to, serving as a part of a larger assembly or as a mold for casting another microcomponent. Each of FIGS. 3G and 3H illustrates a microcomponent having a shape that corresponds to the mold formed in FIGS. 3E and 3F, respectively. That is, FIG. 3G illustrates a microcomponent 40 in the shape of a beam 42 on post 44 with no material under the beam, and FIG. 3H illustrates a microcomponent 40 in the shape of a beam 42 on post 44 with material under the beam. In order to form these microcomponents, the multilayer microstructure is provided as a mold, the cavity of which is then filled with a material that conforms to the shape of the cavity. Typically, the material comprises a metal such as aluminum, zinc, tin, chromium, copper, silver, gold and composites, combinations and alloys thereof. The cavity may be filled with metal through an electroplating process in which case the interior cavity surface should comprise an electrically conductive material that allows metal to be electrochemically deposited thereon. For example, the substrate may serve as plating base. The plating base may be a metal substrate, a silicon or glass substrate, a thick photoresist sheet, or a variety of other materials, including a silicon semiconductor wafer with or without electronic circuitry thereon. If a silicon wafer is utilized, metallic layers may be bonded to the surface of the wafer in order to provide conductive means or in order to create a "sacrificial" metal layer. The use of sacrificial metal layers to form movable microstructures is presented in U.S. Pat. No. 5,190,637 to Guckel et al. The metal layers can be deposited by any conventional method, i.e., thermal evaporation, e-beam, or sputtering. One of ordinary skill in the art will recognize that electroplating may involve submerging the mold in a plating solution and passing current through the electrically conductive material in order to reduce metal ions in the solution resulting in the deposition of metal thereon.

Alternatively or additionally, the cavity of the microstructure may be filled with a polymeric material and optionally an inorganic material such as ceramic or metallic particles. Preferred polymers are curable, and include thermally curable polymers, chemically curable polymers, and photolytically curable polymers. If a thermally curable polymer is used, the temperature to which the polymer composition is heated, during microcomponent fabrication, is kept to the minimum necessary to bring about cure, so as to avoid deformation of the mold and shrinkage. If a chemically curable polymer is used, an appropriate curing agent is typically required. Binder polymers useful in conjunction with the invention include, but are not limited to: vinyl and acrylic polymers such as poly(vinyl alcohol), poly(vinyl amine), poly(vinyl acetate), poly(vinyl halides) including poly(vinyl chloride) and poly(vinyl fluoride), poly (vinylidene halides) including poly(vinylidene chloride) and poly(vinylidene fluoride), polystyrene, poly(o-bromostyrene), poly(m-methylstyrene), poly(p-methylstyrene), poly(o-hydroxystyrene), poly(m-hydroxystyrene), poly(p-hydroxystyrene), poly(vinyl phosphate), poly(vinyl pyrrolidone), poly(methyl vinyl ether), poly(ethyl vinyl ether), poly(methyl vinyl ketone), poly(acrylonitrile), vinyl-pyrrolidone-vinyl acetate copolymers, vinyl acetate-acrylic acid copolymers, vinyl alcohol-vinyl acetate copolymers, vinyl pyrrolidone-styrene copolymers, poly(acrylic acid), poly(acrylamide), poly (methacrylic acid), poly(methyl acrylate), poly(ethyl acrylate), poly(butyl acrylate), poly(acrylonitrile-acrylic acid), poly(styrene-acrylic acid), poly(butadiene-acrylonitrile acrylic acid), poly(butylacrylate-acrylic acid), poly(methyl methacrylate), poly(ethyl methacrylate), poly (ethyl acrylate-acrylic acid), poly(methacrylate-acrylic acid), poly(methyl methacrylate-acrylic acid) and poly (methyl methacrylate-styrene-acrylic acid); silicone resins such as polyhydridosiloxane, poly(methylsiloxane), poly(dimethylsiloxane), poly(ethylsiloxane), poly(diethylsiloxane), poly(phenylsiloxane), poly(methylphenylsiloxane), poly(ethylphenylsiloxane) and poly(diphenylsiloxane); other inorganic, preferably silicon-containing, polymers such as polysilazanes and polysiloxazanes; epoxy resins, i.e., polymers formed by step polymerization of an epoxide such as epichlorohydrin and a dihydroxy compound, wherein suitable dihydroxy compounds include bisphenol A (2,2-bis(4-hydroxyphenyl) propane), hydroquinone, resorcinol, novolacs, and the like; polyesters such as poly(ethylene terephthalate), poly(butylene terephthalate), poly(lactic acid), and copolymers of substituted and/or unsubstituted styrene monomers and ester moieties; polyethers such as polyacetal, poly(ethylene glycol), poly(oxyethylene), poly(oxypropylene) and poly(tetrahydrofuran); and copolymers and blends of any of the foregoing. Optionally, the mold may be filled with thermoplastic polymers, i.e., polymers having a relatively large window of thermostability, using processes including, but are not limited to processing techniques involving extrusion and/or injection molding. Suitable ceramic particles include, but are not limited to: oxides such as silicon oxide, titanium oxide, aluminum oxide and zirconium oxides; and nitrides such as silicon nitride, boron nitride, titanium nitride, and aluminum nitride. By separating the mold from the filler material without substantially disturbing the material, a free standing three-dimensional microcomponent may be formed. This can be done, for example, by fluidizing the mold without disturbing the filler material. Such fluidization may involve melting the mold, dissolving the mold in a solvent or other methods known to one of ordinary skill in the art.

It is evident that the inventive methods may be used to form multilayer microstructure of various geometries and dimensions. For example, the first or second polymeric layer may each have a thickness of approximately 10 to approximately 2000 micrometers, or more preferably, approximately 50 to approximately 500 micrometers. As another example, the first or second patterns may comprise features having a width of approximately 0.5 to approximately 100 micrometers or more preferably approximately 3 to approximately 50 micrometers.

As will be appreciated by those skilled in the art, preparation of such a layered microstructure may involve deposition of a layer of a photodefinable composition on a substrate having a conductive surface, which may or may not be pretreated with an adhesion-promoting layer such as a metal oxide (e.g., oxides of titanium and/or copper) or with a silanization reagent such as methacryloxypropyl trimethoxysilane, to facilitate adhesion of the resist to the substrate surface. Metallized silicon is a preferred substrate.

Suitable photodefinable compositions such as photoresists may comprise, for example, poly(methyl methacrylate) ("PMMA") or copolymers thereof such as poly(methyl methacrylate-co-t-butylmethacrylate), a poly(lactide) such as poly(lactide-co-glycolide), polymethacrylamide, polyoxymethylene, polyalkenesulfone, or poly(glycidylmethacrylate-co-ethyl acrylate), epoxies, phenolics, polymers thereof, copolymers thereof, and combinations thereof. Photodefinable compositions may also contain photactive compounds including, but not limited to, diazonaphthoquinones, iodonium and sulfonium salts and o-nitrobenzyl esters. The resist is deposited using any of a number of conventional techniques, e.g., sequential spin coating, casting, extruding or the like. The deposited resist is irradiated using radiation, e.g., ultraviolet radiation and a mask to provide the desired pattern. Following exposure, the resist is developed using a suitable solvent to remove the irradiated or the non-irradiated areas. One of ordinary skill in the art will recognize that there are many commercially available photoresists having different exposure wavelengths and that custom photoresist compositions may be formulated to have a particular exposure wavelength. For example, photoresists suitable for use in the present invention include those disclosed in U.S. Pat. No. 5,059,512 to Babich et al. In addition, it has been found that SU-8, a negative, epoxy-type, near-UV photoresist based on EPON SU-8 epoxy resin from Shell Chemical Company (Houston, Tex.) is particularly suited for use in the present invention. SU-8 and related photoresists have been described, e.g., in U.S. Pat. No. 4,882,245 to Gelorme et al. and are available from MicroChem Corp. (Newton, Mass.).

Variations on of the present invention will be apparent to those of ordinary skill in the art. For example, in some circumstances, it may be appropriate to use resists of different sensitivities to produce the inventive multilayer microstructures. For example, it may be appropriate to apply both polymeric layers prior to exposure and provide the exposure wavelengths by use of suitable optical filters. In addition, the invention may involve successively applying and exposing more than two different layer of photodefinable composition in order to further increase the aspect ratio of a feature.

It is to be understood that while the invention has been described in conjunction with the preferred specific embodiments thereof, the foregoing description is intended to illustrate and not limit the scope of the invention. Other aspects, advantages and modifications will be apparent to those skilled in the art to which the invention pertains. All patents, patent applications, journal articles and other references cited herein are incorporated by reference in their entireties.

What is claimed is:

1. A method for preparing a multilayer, high aspect ratio microstructure, comprising, in order, the steps of:
    (a) applying a first photodefinable composition having a first exposure wavelength on a substrate to form a first polymeric layer;
    (b) exposing a portion of the first photodefinable composition to electromagnetic radiation of the first exposure wavelength to form a first pattern in the first polymeric layer;
    (c) applying a second photodefinable composition having a second exposure wavelength directly on the first polymeric layer to form a second polymeric layer;
    (d) exposing a portion of the second photodefinable composition to electromagnetic radiation of the second exposure wavelength to form a second pattern in the second polymeric layer; and
    (e) removing a portion of each layer according to the patterns to form a multilayer microstructure having a cavity having a shape that corresponds to the portion removed from the layers, thereby forming the multilayer microstructure,
    wherein at least one of the first and second polymeric layers have a thickness of at least 10 micrometers and the first and second exposure wavelengths different.

2. The method of claim 1, wherein the first pattern is substantially identical to the second pattern.

3. The method of claim 2, wherein the cavity has an aspect ratio of at least approximately 30:1.

4. The method of claim 3, wherein the cavity is composed of a first polymeric layer portion and a second polymeric layer portion and further wherein each layer portion has an aspect ratio of at least approximately 15:1.

5. The method of claim 3, wherein the aspect ratio of the cavity is at least 40:1.

6. The method of claim 5, wherein the cavity is composed of a first polymeric layer portion and a second polymeric layer portion and further wherein each layer portion has an aspect ratio of at least 20:1.

7. The method of claim 1, wherein the first pattern is substantially different from the second pattern.

8. The method of claim 1, wherein the first, the second or both curable compositions are selected from the group consisting of acrylates, methacrylates, epoxies, phenolics, polymers thereof, copolymers thereof and combinations thereof.

9. The method of claim 1, wherein one of the first and second exposure wavelengths is an ultraviolet wavelength.

10. The method of claim 9, wherein both the first and the second exposure wavelengths are ultraviolet wavelengths.

11. The method of claim 1, wherein one of the first and second exposure wavelengths is a visible wavelength.

12. The method of claim 11, wherein both the first and the second exposure wavelengths are visible wavelengths.

13. The method of claim 1, wherein step (d) further comprises simultaneously exposing the second photodefinable composition to electromagnetic radiation of the first exposure wavelength.

14. The method of claim 13, wherein the second polymeric layer is substantially transparent to electromagnetic radiation having the first exposure wavelength.

15. The method of claim 13, wherein the second polymeric layer is substantially opaque to electromagnetic radiation having the first exposure wavelength.

16. The method of claim 1, wherein the first or second polymeric layer has a thickness of approximately 10 to approximately 1000 micrometers.

17. The method of claim 16, wherein the first or second polymeric layer has a thickness of approximately 50 to approximately 500 micrometers.

18. The method of claim 1, wherein the first or second pattern comprise features having a width of approximately 0.5 to approximately 100 micrometers.

19. The method of claim 18, wherein the first or second pattern comprise features having a width of approximately 3 to approximately 50 micrometers.

20. A method for forming a three-dimensional microcomponent, comprising the steps of:
(f) providing the multilayer microstructure formed in claim 1 as a mold; and
(g) filling the cavity of the multilayer microstructure with a filler material that conforms to the shape of the cavity.

21. The method of claim 20, further comprising, after step (g), (h) separating the mold from the filler material without substantially disturbing the material.

22. The method of claim 21, wherein step (h) comprises subjecting the mold to a condition that fluidizes the mold without fluidizing the filler material.

23. The method of claim 20, wherein the filler material comprises a metal.

24. The method of claim 23, wherein the metal is selected from the group consisting of: aluminum, zinc, tin, chromium, copper, silver, gold and composites, combinations and alloys thereof.

25. The method of claim 23, wherein step (g) comprises electroplating the metal within the cavity.

26. The method of claim 20, wherein the filler material comprises a ceramic.

27. The method of claim 20, wherein the filler material comprises solid particles and a binder.

28. The method of claim 1, wherein step (b) is carried out by positioning a filter between an electromagnetic radiation source capable of generating electromagnetic radiation having both the first and second wavelength and the substrate.

29. The method of claim 1, wherein step (d) is carried out by positioning a filter between an electromagnetic radiation source capable of generating electromagnetic radiation having both the first and second wavelength and the substrate.

* * * * *